(12) United States Patent
Van Cleemput et al.

(10) Patent No.: US 6,576,345 B1
(45) Date of Patent: Jun. 10, 2003

(54) DIELECTRIC FILMS WITH LOW DIELECTRIC CONSTANTS

(76) Inventors: Patrick A. Van Cleemput, 376 Flora Vista Ave., Sunnyvale, CA (US) 94086; Ravi Kumar Laxman, 6270 Skywalker Dr., San Jose, CA (US) 95135; Jen Shu, 19393 Dehavilland Dr., Saratoga, CA (US) 95070; Michelle T. Schulberg, 445 College Ave., Palo Alto, CA (US) 94306; Bunsen Nie, 42706 Hamilton Way, Fremont, CA (US) 94538

( * ) Notice: Subject to any disclaimer, the term of this patent is extended or adjusted under 35 U.S.C. 154(b) by 41 days.

(21) Appl. No.: 09/727,796

(22) Filed: Nov. 30, 2000

(51) Int. Cl.$^7$ .................. B32B 25/20; H01L 21/31; H01L 21/12
(52) U.S. Cl. .............. 428/447; 428/601; 428/902; 438/780; 257/499; 257/506; 257/510; 427/255.11; 427/255.18; 427/387; 427/901; 427/FOR 101; 216/17; 216/18; 524/860
(58) Field of Search ................ 438/780; 21/17, 21/18; 524/860; 427/255.11, 255.18, 387, 901, FOR 101; 428/447, 603, 902; 257/510, 499, 506

(56) References Cited

U.S. PATENT DOCUMENTS

| | | | |
|---|---|---|---|
| 4,737,384 A | | 4/1988 | Murthy et al. |
| 4,970,093 A | | 11/1990 | Sievers et al. |
| 5,185,296 A | | 2/1993 | Morita et al. |
| 5,304,515 A | | 4/1994 | Morita et al. |
| 5,484,867 A | * | 1/1996 | Lichtenhan et al. ........... 528/9 |
| 5,665,527 A | | 9/1997 | Allen et al. |
| 5,710,187 A | | 1/1998 | Steckle, Jr. et al. |
| 5,789,027 A | | 8/1998 | Watkins et al. |
| 5,939,500 A | * | 8/1999 | Itoh et al. .................... 525/478 |
| 5,949,130 A | * | 9/1999 | Fukuyama et al. ......... 257/632 |
| 6,143,855 A | * | 11/2000 | Hacker et al. ................ 528/31 |
| 6,214,748 B1 | * | 4/2001 | Kobayashi et al. ......... 438/782 |
| 6,218,497 B1 | * | 4/2001 | Hacker et al. ................ 528/31 |
| 6,252,030 B1 | * | 6/2001 | Zank et al. ................... 528/31 |
| 6,383,917 B1 | * | 5/2002 | Cox ........................... 438/637 |
| 6,420,084 B1 | * | 7/2002 | Angelopoulos et al. .. 430/270.1 |
| 2002/0192980 A1 | * | 12/2002 | Hogle et al. ................ 438/778 |

OTHER PUBLICATIONS

Biberger et al., "High Pressure Processing Chamber for Semiconductor Substrate", Pub. No. US 2002/0046707 A1, Pub. Date: Apr. 25, 2002, Appl. No.: 09/912,844, Filed: Jul. 24, 2001, pp. 1–19.
Hybrid Plastics, *The Next Generation of Chemical Technology has Arrived!*, http://www.hybridplastics.com, Printed from website on Oct. 17, 2000, 8 Pages.
Silsesquioxanes, *Building Blocks & Reagents*, http://www.sigma–aldrich.com, Printed from website on Oct. 17, 2000, 6 Pages.
Gelest, Inc., pp. 198 & 216, Catalog published prior to Nov., 2000.
Hybrid Plastics, *Nanostructured Chemicals*, http://www.hybridplastics.com, Printed from website on Oct. 17, 2000, 6 Pages.
R.D. Miller et al., *Phase–Separated Inorganic–Organic Hybrids for Microelectronic Applications*, MRS Bulletin, PP 44–48, Oct. 1997.
Jin et al., *Nanoporous Silca as an Ultralow–k Dielectric*, MRS Bulletin, PP 39–42, Oct. 1997.
Nigel P. Hacker, *Organic and Inorganic Spin–On Polymers for Low–Dielectric–Constant Applications*, MRS Bulletin, PP 33–38, Oct. 1997.

* cited by examiner

*Primary Examiner*—Robert Dawson
*Assistant Examiner*—Jeffrey B. Robertson
(74) *Attorney, Agent, or Firm*—Beyer Weaver & Thomas, LLP (57) ABSTRACT

Thin films possessing low dielectric constants (e.g., dielectric constants below 3.0) are formed on integrated circuits or other substrates. Caged-siloxane precursors are linked in such a way as to form dielectric layers, which exhibit low dielectric constants by virtue of their silicon dioxide-like molecular structure and porous nature. Supercritical fluids may be used as the reaction medium and developer both to the dissolve and deliver the caged-siloxane precursors and to remove reagents and byproducts from the reaction chamber and resultant porous film created.

45 Claims, 7 Drawing Sheets

DIELECTRIC FILMS WITH LOW DIELECTRIC CONSTANTS

FIELD OF THE INVENTION

This invention relates to a method and apparatus for forming and depositing a dielectric layer on a substrate. More particularly, it relates to using supercritical fluids as mediums in which caged-siloxane precursors are linked and deposited to form dielectric films with dielectric constants below 3.0 for use in integrated circuit fabrication.

BACKGROUND OF THE INVENTION

Supercritical fluids are well defined in the art. Supercritical fluids or solutions exist when the temperature and pressure of a solution are above its critical temperature and pressure. In this state, there is no differentiation between the liquid and gas phases and the fluid is referred to as a dense gas in which the saturated vapor and saturated liquid states are identical. Near supercritical fluids or solutions exist when the reduced temperature and pressure of a solution are both greater than 0.8 but the solution is not yet in the supercritical phase. Due to their high density, supercritical and near supercritical fluids possess superior solvating properties.

Supercritical fluids have been used in thin film processing and other applications as developer reagents or extraction solvents. Morita et al. (U.S. Pat. Nos. 5,185,296 and 5,304,515) describe a method in which supercritical fluids are used to remove unwanted organic solvents and impurities from thin films deposited on substrates. Allen et al. (U.S. Pat. No. 5,665,527) describe a high resolution lithographic method in which a supercritical fluid is used to selectively dissolve a soluble unexposed portion of polymeric material from a substrate, thereby forming a patterned image. In recognition of the superior solvating properties of supercritical fluids, Steckle et al. (U.S. Pat. No. 5,710,187) describe a method for removing impurities from highly cross-linked nanoporous organic polymers. A key function of the supercritical solvent in the Steckle et al. method is to penetrate the nanoporous structure effectively so as to remove all traces of organic solvents and unreacted monomer.

Methods for depositing thin films using supercritical fluids also have been reported. Murthy et al. (U.S. Pat. No. 4,737,384) describe a method for depositing metals and polymers onto substrates using supercritical fluids as the solvent medium. Sievers et al. (U.S. Pat. No. 4,970,093) teach a chemical vapor deposition method (CVD), in which a supercritical fluid is used to dissolve and deliver a precursor in aerosol form to a conventional CVD reactor. Watkins et al. (U.S. Pat. No. 5,789,027) describe a method termed Chemical Fluid Deposition (CFD) for depositing a material onto a substrate surface. In this method a supercritical fluid is used to dissolve a precursor of the material to be deposited. This is done in the presence of the substrate. Once dissolved, a reaction reagent is introduced that initiates a chemical reaction involving the precursor, thereby depositing the material onto the substrate. This method takes advantage of supercritical fluids as mediums for reagent transport, reaction, and removal of impurities.

Although the described methods take advantage of the unique properties of supercritical fluids, the utility of supercritical fluids in semiconductor fabrication has only begun to be realized.

Dielectric films are of great importance in the microelectronics industry. Modern integrated circuit design relies heavily on the deposition of high-purity dielectric films on substrates. With integrated circuit designs and line-widths becoming smaller and smaller, the need for dielectrics with lower dielectric constants (low-k materials) is more critical due to capacitance effects set up between conducting and non-conducting layers.

Low-k materials are now commonly made from organic or inorganic polymers as reported by Hacker, *Materials Research Society Bulletin*, vol. 22, no. 10, pp. 33–38. Low-k organic polymers generally do not possess the thermal or mechanical properties required for integrated circuit applications, i.e. they have low glass transition temperatures, are too soft, or have poor mechanical properties. Inorganic polymers are often based on siloxane polymerization chemistry, in which the resultant polymers closely mimic silicon dioxide structure. The term siloxane is used in this application to refer to any class of molecules having at least one organic group and oxygen(s) bound to silicon. Silsesquioxanes are a class of siloxanes having the empirical formula $RSiO_{1.5}$ where R is any organic group. Silsesquioxanes are common precursors for forming polymeric silicon-dioxide-like dielectric materials. Silsesquioxanes can have essentially two-dimensional ladder-type or well defined three-dimensional caged structures. Upon polymerization (typically done with a high temperature bake) both structure types form ladder-type cross-linked polymers. In the latter scenario, the cage structures are destroyed in the baking process in favor of a new cross-linked matrix. Although these inorganic polymers have the required thermal properties and toughness for integrated circuit applications they are often brittle and the high temperature curing raises the dielectric constant of the final material relative to pre-bake material. Incorporation of organic moieties into the inorganic polymer matrix can add some resistance to cracking relative to purely inorganic matrices as well as lower dielectric constants, but these issues remain problematic.

Nanoporous silica can provide low-k dielectric materials as reported by Changming et al., *Materials Research Society Bulletin*, vol. 22, no. 10, pp. 39–42. In this case the major variable determining the dielectric constant is the density of the material. As the density decreases the dielectric constant decreases, and thus porosity is important. Nanoporous silica films are commonly formed by depositing a monomeric precursor such as tetraethyl orthosilicate or TEOS (a siloxane) onto a substrate using a solvent, and then cross-linking the precursors to form a continuous porous solid network. The resultant films are dried by direct solvent evaporation or treatment with supercritical fluids. The films are then subjected to a high-temperature annealing step. Such films suffer from mechanical instability and cracking due to thermal expansion mismatch stresses during the high temperature annealing.

Miller et al., *Materials Research Society Bulletin*, vol. 22, no. 10, pp. 44–48, report the development of inorganic-organic nanophase-separated hybrid polymer materials. These materials comprise organic polymers cast with silsesquioxane-based ladder-type polymeric structures. A casting solvent is used to dissolve the inorganic and organic polymer components. The materials are spin coated onto a substrate and upon application of high temperature, the hybrid phase-separated polymer materials are formed. The materials may offer some improvements in crack resistance over bulk-fused silica. The high process temperatures associated with this method can be a liability to achieving desirable low-k materials.

In spite of the considerable research effort that has gone into developing new low-k dielectric materials and methods of integrating them into conventional IC fabrication procedures, there is still considerable room for improvement both in selection of the materials and development of better deposition processes.

SUMMARY OF THE INVENTION

Generally, the invention provides methods and apparatus for forming thin films possessing low dielectric constants (e.g., dielectric constants below 3.0) on integrated circuits or other substrates. The method of the invention features linking caged-siloxane precursors in such a way as to form dielectric layers which exhibit low dielectric constants by virtue of their silicon dioxide-like molecular structure and porous nature. Supercritical fluids may be used as the reaction medium and developer both to the dissolve and deliver the caged-siloxane precursors and to remove reagents and byproducts from the reaction chamber and resultant porous film created. Since the deposition of the thin film dielectric occurs under supercritical or near supercritical fluid conditions (e.g., about 50° C. and 1000 psi) and does not require a subsequent high-temperature anneal, the method offers advantages over conventional methods. In addition, the apparatus of the invention features a way to selectively protect one side of the integrated circuit or other substrate under the high-pressure conditions necessary for supercritical fluid formation and use.

One aspect of the invention pertains to integrated circuits or partially fabricated integrated circuits including a dielectric layer, which has multiple chemically linked caged siloxane moieties. In one example, the caged siloxane moieties are silsesquioxanes. In a particularly preferred embodiment, the caged siloxane moieties are obtained from polyhedral oligomeric silsesquioxanes (POSS) monomers. In order to introduce voids into the dielectric layer, the caged siloxane moieties preferably have a cage diameter of between about 5 and 50 Angstroms, and more preferably between about 10 and 20 Angstroms.

To provide a stable linkage, the caged siloxane moieties employ various side groups such as organic linkers. In one embodiment, a polymerization reaction links the caged siloxane moieties to one another. Examples of suitable polymerizable side chains include acrylates, methacrylates, carboxylic acids, carboxylic acid halides, halosilanes, carboxylic acid esters, sulphonic acid esters, carbamoyl halides, epoxides, isocyanates, nitrites, olefins, styrenes, amines, alcohols, alkyl halides, aryl halides, sulphonic acids, sulphonic acid halides, phosphines, silanols, and silanes. In another example, the caged siloxane moieties are linked to one another by non-covalent self-assembly. In an alternative embodiment, the caged siloxane moieties are grafted on the integrated circuit or partially fabricated integrated circuit. They may be grafted using the reactive side chains identified above, for example. Regardless of the linking or bonding technique, the caged siloxane moieties in the dielectric layer may be either homogeneous or mixed (containing at least two chemically distinct species of caged siloxane).

The dielectric layers should possess certain physical properties that impart both mechanical strength and a low dielectric constant. To provide a low dielectric constant, the dielectric layers should have a significant amount of void space. In one embodiment, the dielectric layer has a porosity of between about 25% and 75%. More preferably, the dielectric layer has a porosity of between about 40% and 60%. Preferably, the dielectric layer has an average pore size of at most about 200 Angstroms; more preferably between about 5 and 25 Angstroms. Preferably, the dielectric layer has a dielectric constant of at most about 3.5, more preferably at most about 2.5, and most preferably at most about 2.

The dielectric layers of this invention may be used as inter-layer dielectrics, which electrically separate the substrate from a first metal layer in integrated circuits. Or they may be used as inter-metal dielectrics, which electrically separate two or adjacent metal layers. Preferably, the dielectric layers are used in a damascene process. In this context, they may be used as either the first or second layer of a dual damascene dielectric structure. In a typical integrated circuit embodiment, the dielectric layer has a thickness of at most about 10,000 Angstroms. For some applications, the thickness will be at most about 5,000 Angstroms.

Another specific aspect of this invention pertains to methods of forming a dielectric layer in an integrated circuit. The method may be characterized by the following sequence: (a) contacting a partially fabricated integrated circuit with a carrier containing caged siloxane species; and (b) linking the caged siloxane species to form the dielectric layer on the partially fabricated integrated circuit. As suggested above, the carrier is preferably a supercritical fluid or near-supercritical fluid. Examples of suitable supercritical fluids for use with this invention include supercritical carbon dioxide, supercritical ammonia, supercritical water, supercritical ethanol, supercritical ethane, supercritical propane, supercritical butane, supercritical pentane, supercritical dimethyl ether, supercritical hexafluoroethane, and mixtures thereof.

The process may involve converting the carrier to a supercritical state, either prior to or upon contact with the partially fabricated integrated circuit. Typically the carrier is removed (e.g., flushed from the partially fabricated integrated circuit) after linking the caged siloxane species. The carrier may also be used to remove byproducts of the linking reaction and/or unreacted caged siloxane species.

Preferably, the caged siloxane species used in the process contain the caged siloxane moieties, linking moieties, and other chemical features as described above. For example, the caged siloxane species may be of tris(dimethylvinyl)-POSS, methacrylfluoro(3)-POSS, or methacrylfluoro(13)-POSS. These or other caged siloxane species may be linked to one another by polymerization or non-covalent self assembly for example.

After the dielectric layer is formed in accordance with this invention, it may be further processed as required by any integrated circuit fabrication procedure. For example, the layer may be etched the dielectric layer to forms at least one of vias and trenches. Preferably, a damascene process is employed.

Yet another aspect of this invention pertains to apparatus allowing formation of a low dielectric constant dielectric layer on a partially fabricated integrated circuit. The apparatus may be characterized by the following features: (a) a reaction vessel capable of withstanding pressure and temperature associated with generating and/or using a supercritical or near-supercritical fluid; and (b) a chuck for positioning and holding the partially fabricated integrated circuit to allow depositing a dielectric layer on an active side of the partially fabricated integrated circuit, while protecting a back side of the partially fabricated integrated circuit. The apparatus may also include a source of the supercritical or near-supercritical fluid. It may also include a source of caged siloxane species.

These and other features and advantages of the present invention will be described in more detail below with reference to the associated figures.

BRIEF DESCRIPTION OF THE DRAWINGS

The following detailed description will be better understood when viewed in conjunction with the drawings in which.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. For example caged silsesquioxanes are described as precursors for the invention. Other caged-siloxane molecules may be used. Also, the precursors for the method need not be completely closed caged structures; partially closed cages or bowl-shaped molecules would also qualify as "caged siloxanes" for purposes of this invention. In some descriptions herein, well-known processes, procedures and components have not been described in detail so as not to unnecessarily obscure aspects of the present invention.

The method of the current invention combines supercritical fluid transport and solvation with inorganic-organic hybrid polymer chemistry to form thin film dielectrics on substrates. More particularly, the supercritical fluids are used to: (1) dissolve precursor molecules (or otherwise render the molecules transportable), (2) deliver the solute (or suspended) molecules to the desired substrate, (3) serve as a reaction medium for linking the molecules, and (4) serve a solvent or transport medium to remove unwanted materials from the deposited dielectric film, substrate, and reaction vessel. Caged-siloxanes are used as precursors to form porous polymeric low-k thin film dielectrics.

Figure 1A:
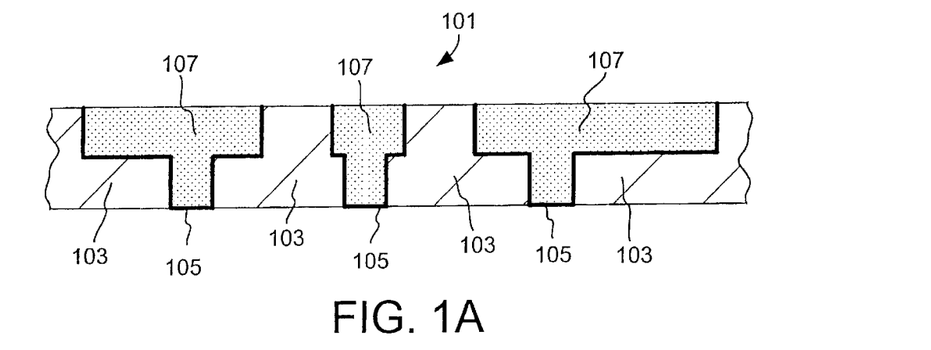
FIGS. 1A–E presents cross-sectional depictions of a partially fabricated integrated circuit at various stages in a method of forming a dielectric of this invention as part of a dual damascene process.

In one embodiment of the invention, the method is used to deposit low dielectric materials onto a partially-fabricated integrated circuit. Various integrated circuit fabrication procedures may profit from use of the dielectric layers of this invention. One example is presented in FIGS. 1A–1E. An example of a typical substrate used for dual damascene fabrication is illustrated in cross sectional form in FIG. 1A. This substrate 101 includes a pre-formed dielectric layer 103 (such as silicon dioxide or that of the invention) with etched line paths (trenches and vias) in which; a diffusion barrier layer 105 has been deposited followed by inlaying with copper conductive routes 107. Because copper or other mobile conductive material provides the conductive paths of the semiconductor wafer, the underlying silicon devices must be protected from metal ions (e.g., copper) that might otherwise diffuse into the silicon. Suitable materials for diffusion barrier layer 105 include tantalum, tantalum nitride, tungsten, titanium, and titanium tungsten. In a typical embodiment, the barrier layer is formed by a PVD process such as sputtering. Typical metals for the conductive routes are aluminum and copper. More frequently, copper serves as the metal in damascene processes such as the depicted in these figures. The resultant partially-fabricated integrated circuit 101 is a representative substrate for the method of the invention.

Figure 1B:
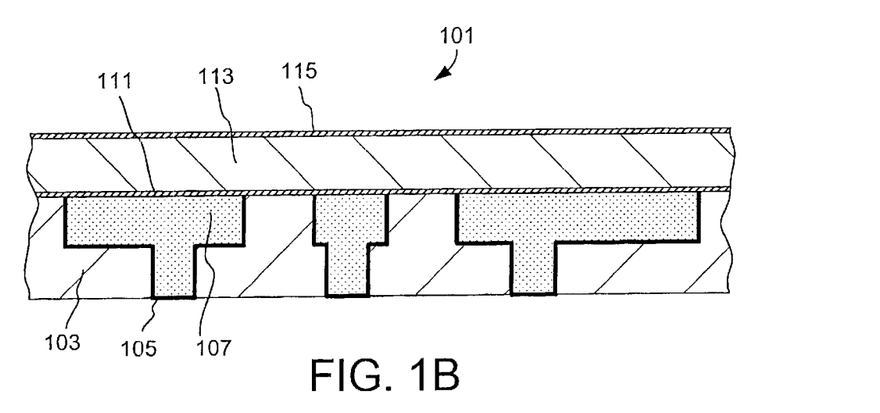

While details of the preferred embodiment may be found below in this application, a short description of the process will now be provided to facilitate understanding the context of the present invention. Illustrated in FIG. 2 is a flowchart representation of a process, 201, of depositing low-k dielectric materials on a partially fabricated integrated circuit substrate 101 in a dual damascene fabrication process. Schematic cross-sectional representations of a specific embodiment for this process are provided in FIGS. 1B–E. First, as indicated at block 203, deposition of a barrier layer is formed on the substrate surface. For example as shown in FIG. 1B, a silicon nitride or silicon carbide diffusion barrier 111 is deposited to encapsulate conductive routes 107. Next, in block 205 of process 201, caged-siloxane precursors are deposited and linked to form a first dielectric layer of a dual damascene dielectric structure. In a specific embodiment of the linking identified at block 205 involves polymerization of caged-siloxane monomers to form a porous hybrid inorganic-organic polymeric layer 113. This is followed by deposition of an etch-stop layer 115 (typically composed of silicon nitride or silicon carbide) on the first dielectric layer 113. See block 207 of FIG. 2.

Figure 1C:
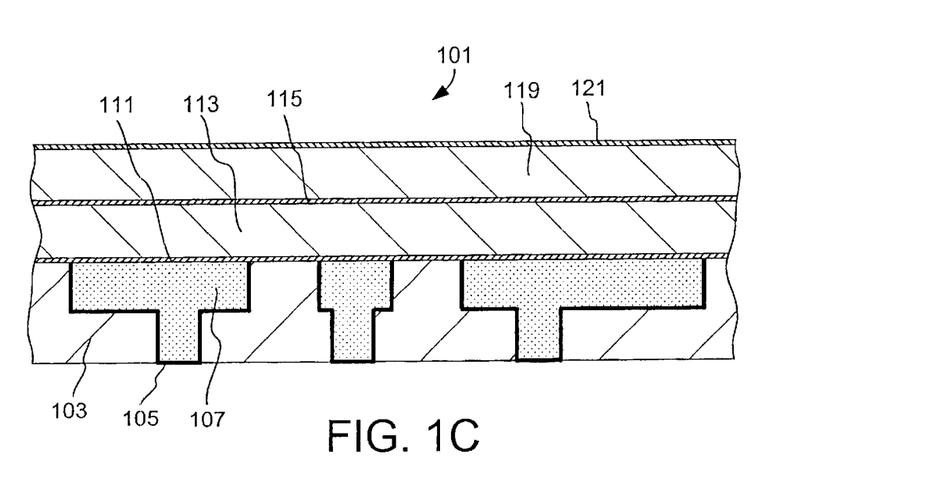
Figure 1D:
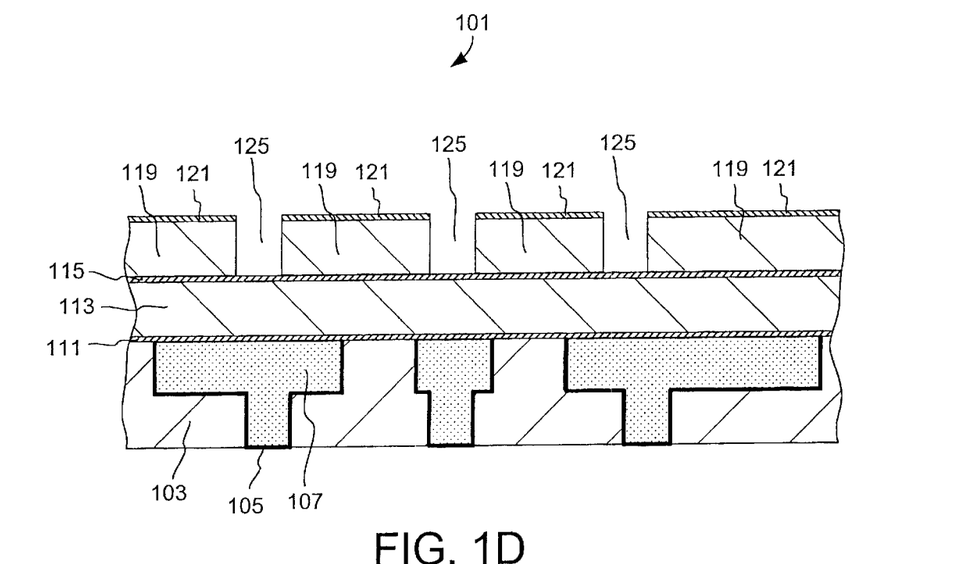
Figure 1E:
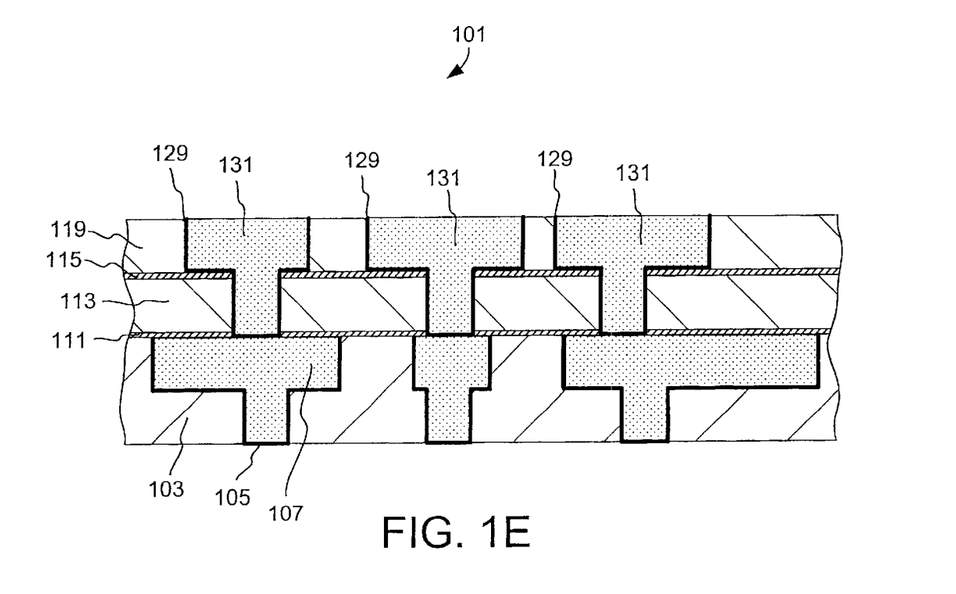
Figure 2:
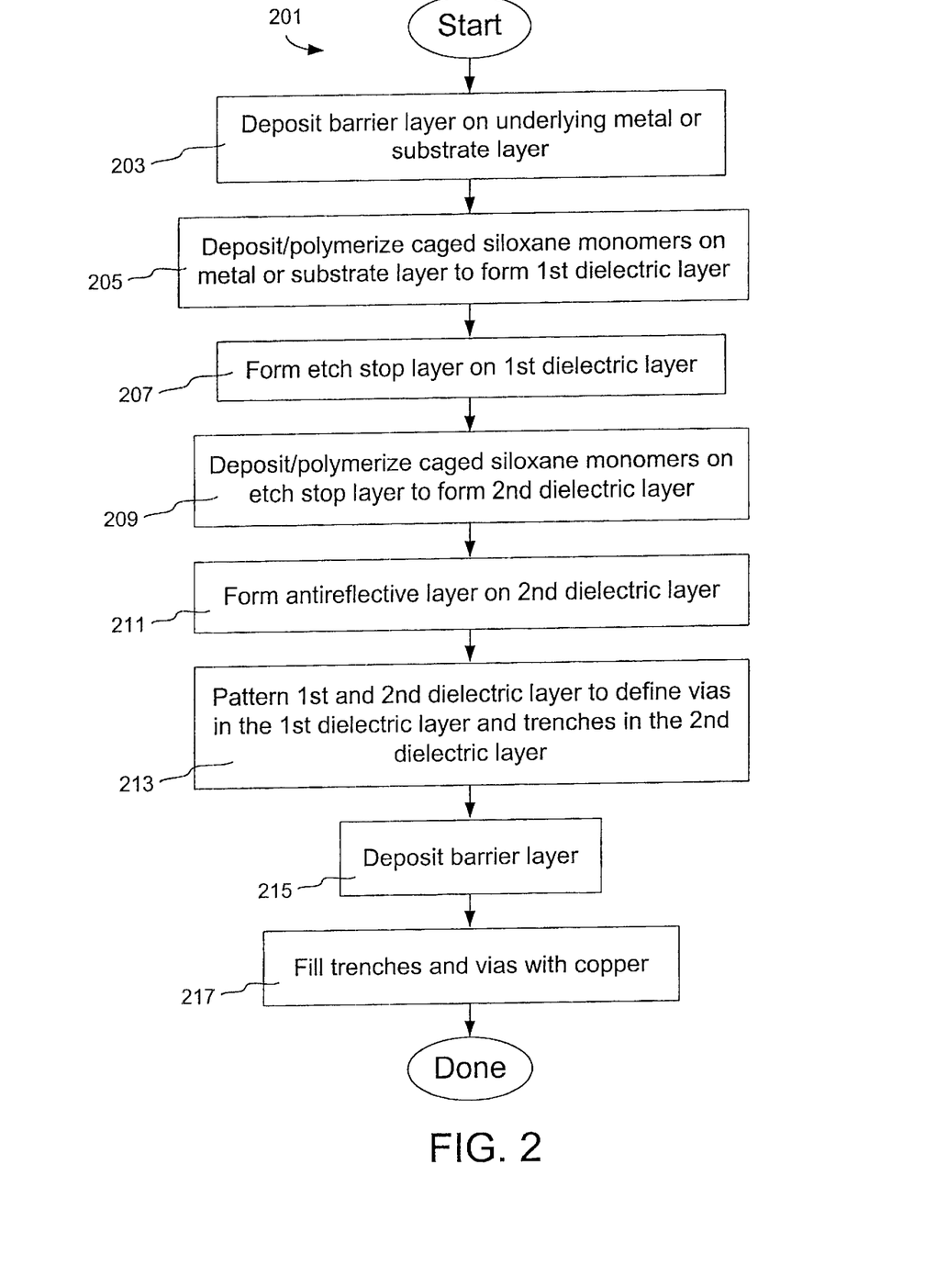
FIG. 2 is a flowchart of the method of depositing the dielectric on a partially fabricated integrated circuit in a dual damascene process.

The process follows with operation 209, as depicted FIG. 1C, where a second dielectric layer 119 of the dual damascene dielectric structure is deposited in a similar manner to the first dielectric layer 113, onto etch-stop layer 115. Deposition of an antireflective layer 121, typically a silicon oxynitride, follows as indicated at the next block, 211 in FIG. 2.

Process 201 continues at 213 (depicted in FIGS. 1D–E) with etching of vias and trenches in the first and second dielectric layers. First, vias 125 are etched through antireflective layer 121 and the second dielectric layer 119. Standard lithography techniques are used to etch a pattern of these vias. The etching of vias 125 is controlled such that etch-stop layer 115 is not penetrated. In a subsequent lithiography process where antireflective layer 121 is removed and trenches are etched in the second dielectric layer 119; vias 125 are propagated through etch-stop layer 115, first dielectric layer 113, and diffusion barrier 111. Next as indicated at block 215, and depicted in FIG. 1E, these newly formed vias and trenches are, as described above, coated with a diffusion barrier 129, followed by operation 217, inlaying with copper conductive routes 131. The copper routes 107 and 131 are now in contact and form conductive pathways as they are separated by only by diffusion barrier 129 which is itself sufficiently conductive.

Thus in the process described in FIG. 2, low-k dielectric materials are positioned between conductive routes. Again, with integrated circuit designs and line-widths becoming smaller and smaller, the need for dielectrics with lower dielectric constants is more critical due to capacitance effects set up between conducting and non-conducting layers. This example illustrates one embodiment of the invention that addresses that need directly.

Figure 3:
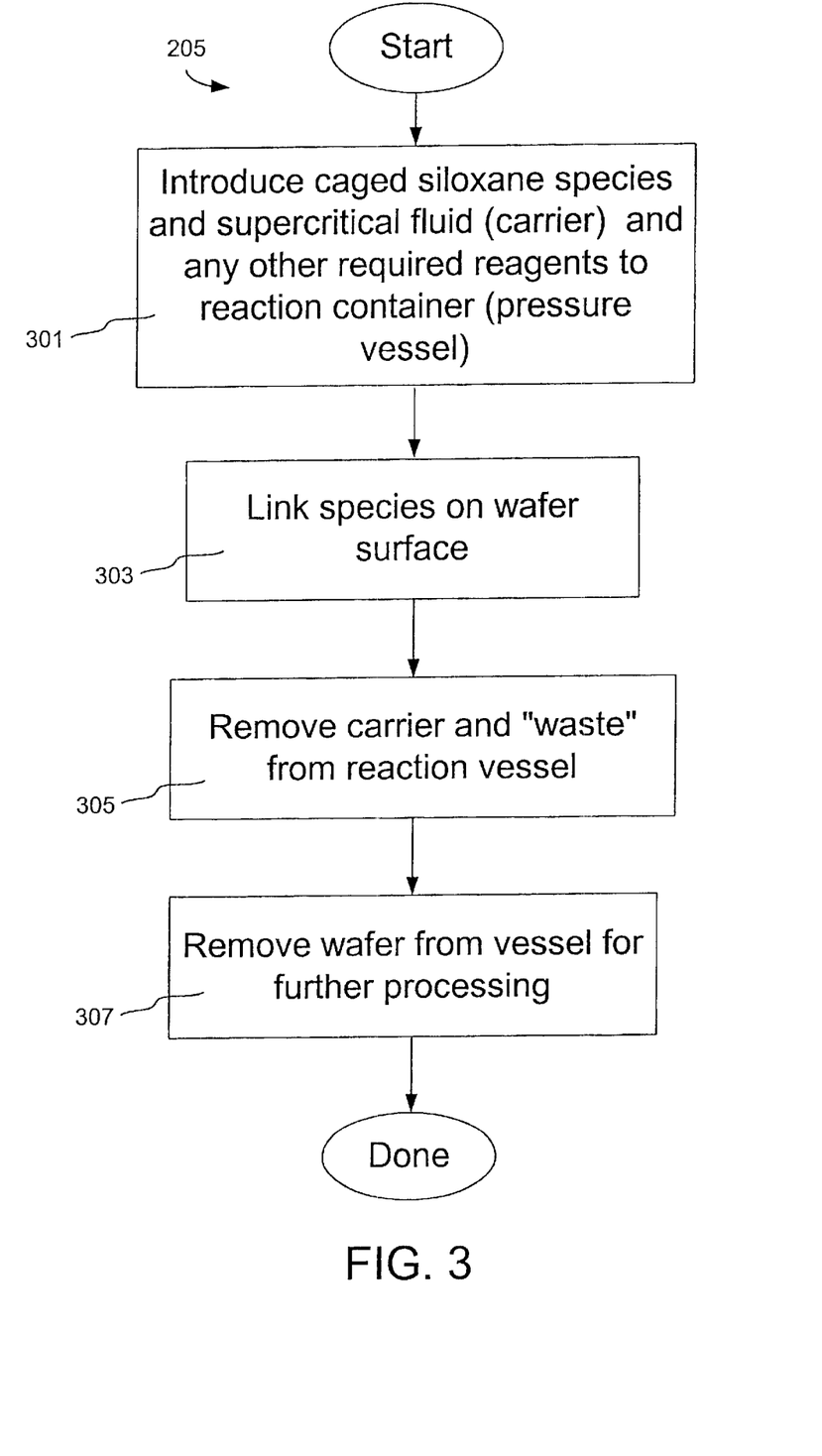
FIG. 3 is a flowchart of the preferred embodiment of the method of depositing the dielectric on a substrate.

In a specific embodiment, the operations 205 and 209 (deposit and polymerize caged siloxane monomers) of process 201 are described in more detail in flowchart form in FIG. 3. The process begins at 301, where a caged-siloxane monomer, carrier fluid medium or "carrier" (for example supercritical carbon dioxide), and any other required reagents are introduced into the reaction container. Assuming that a supercritical carrier is employed, the reaction vessel is a pressure vessel. The subsequent reaction, 303, involves polymerization of the caged-siloxane monomers and deposition of the polymer onto the substrate surface (a silicon wafer for example). Next the carrier, excess monomer, reagents, or any reaction by products are removed in operation 305. Flushing the reaction container with fresh supercritical fluid does this. Finally in operation 307, the pressure is lowered which releases the supercritical fluid and the wafer is removed from the vessel for further processing.

Figure 4A:
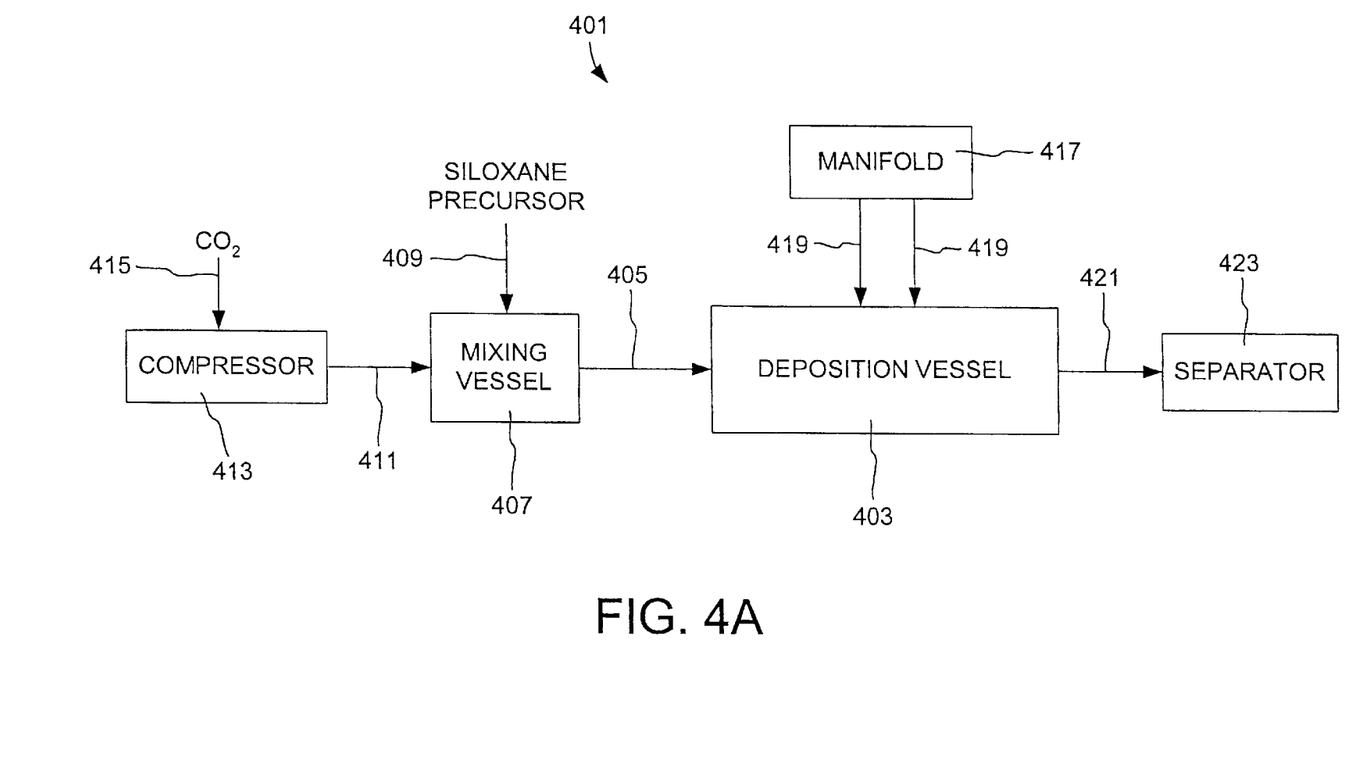
FIG. 4A shows a block diagram of the apparatus for depositing the dielectric on a substrate.

A schematic of the apparatus is depicted in FIG. 4A. Apparatus 401 has five main parts. Deposition vessel 403 is where the actual deposition takes place. Reaction components and carrier are introduced to 403 through feed line 405. Before these components are delivered via 405, they are combined in a mixing vessel 407. Siloxane precursor and supercritical fluid carrier are supplied to mixing vessel 407 via feed lines 409 and 411, respectively. Typically stainless steel is used to construct mixing vessel component 407 of the apparatus. The siloxane precursor is commonly a solid in powder form, and thus 409 can be simply an addition port. The siloxane may be added in powder form or as a slurry in a non-supercritical liquid carrier. Feed line 411 must be able to withstand high-pressure because it delivers supercritcal fluid (typically 1000 to 2000 psi). The supercritical fluid is generated in compressor 413, from for example $CO_2$, which is delivered via feed line 415. The substrate is placed in deposition vessel 403 prior to delivery of siloxane and carrier via 405. Alternatively, siloxane, catalysts, or other reaction components may be introduced into 403 via feed lines 419. Manifold 417 allows for addition of solids, liquids, gases, or slurries to the deposition vessel via feed lines 419 and thus lines 419 may be addition ports, gas/liquid lines, syringes, or other suitable delivery hardware components. As mentioned, the siloxane may be added either via 409 or 419 or both depending on the particular protocol. Once the deposition is complete, additional supercritical fluid is passed through the system via ports 411, 405, and 421 to remove unwanted reaction materials. The "washes" are collected in separator 423, in which the supercritical fluid and any other volatile reaction materials, solvents, or carriers are evaporated and then non-volatile waste is removed.

Figure 4B:
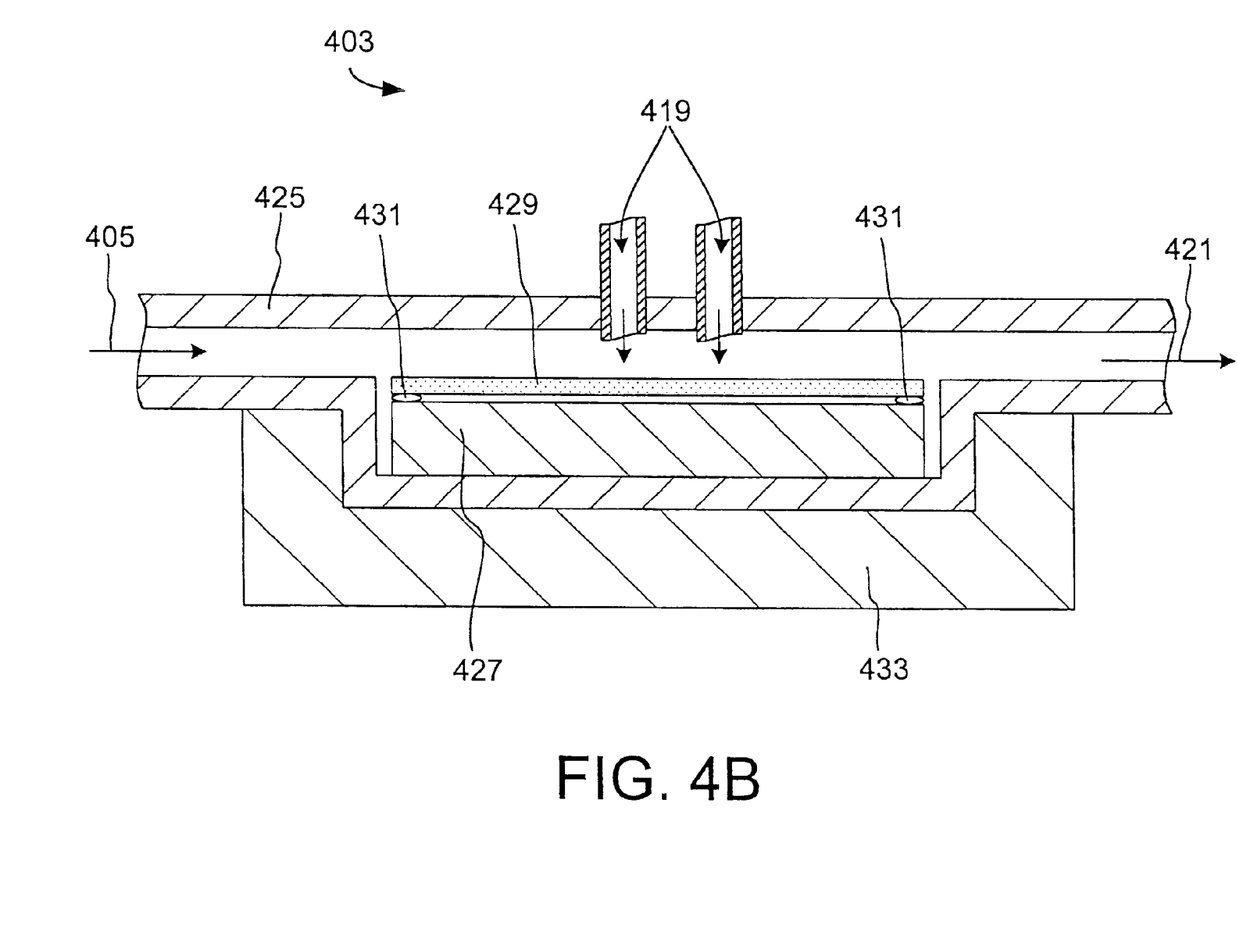
FIG. 4B shows a block diagram of the deposition vessel component of the apparatus for depositing the dielectric on a substrate.

A schematic of the deposition vessel of the apparatus is depicted in FIG. 4B. Apparatus 403 is a high-pressure reaction vessel similar to those used for supercritical fluid processing. In one embodiment, a commercially available system is modified to enable this invention. Examples of systems that can be modified in accordance with this invention are those available from SSI (Supercritical Systems Inc.) or GTI (GT Equipment Technologies). In FIG. 4B, arrows indicate the flow of supercritical medium in and out of the chamber through ports 405 and 421 respectively. The reaction chamber is shallow to minimize the volume of supercritical fluid needed in the deposition process. Typically stainless steel is used to construct reaction vessel component 403. The reaction vessel contains a built in stage 427 for positioning the substrate in the vessel during the deposition process. In this example a silicon wafer 429 is mounted on stage 427. The reaction vessel is of a size to accommodate standard wafers of 100, 150, 200, or 300 millimeters or other custom substrates of various sizes or configurations. A key component of this system is the ability to protect the backside of the substrate. In this embodiment, a gasket 431, specially designed to withstand supercritical fluid conditions, is depicted. Of course other methods for protecting the backside are included in the invention, for example pre-coating the backside of the wafer with a polymer, epoxy resin, or other film before deposition of the dielectric. The wafer is held in place by a vacuum chuck or electrostatic chuck incorporated into stage 427. Reaction vessel 403 is also fitted with a heating stage 433. This gives the apparatus the versatility of heating the substrate via the vessel and stage if necessary. Various reagents can be introduced into the supercritical medium in mixing vessel 407 (FIG. 4A) prior to entry through port 405 or they can be introduced directly to the reaction chamber through ports 419. This allows for addition of catalysts, co-solvents, carriers, or other reagents to precursors in the supercritical reaction medium. Any reagent additions are done at a pressure slightly higher than that of the reaction vessel to avoid back flow into feed lines. Again, after the deposition is complete, additional supercritical fluid is passed through the system via ports 405 and 421 to remove unwanted reaction materials.

Important to understanding the invention is a description of the low-k dielectric films both on a molecular level, according to how they are formed, and on a macroscopic level, according to their bulk properties once formed.

Figure 5:
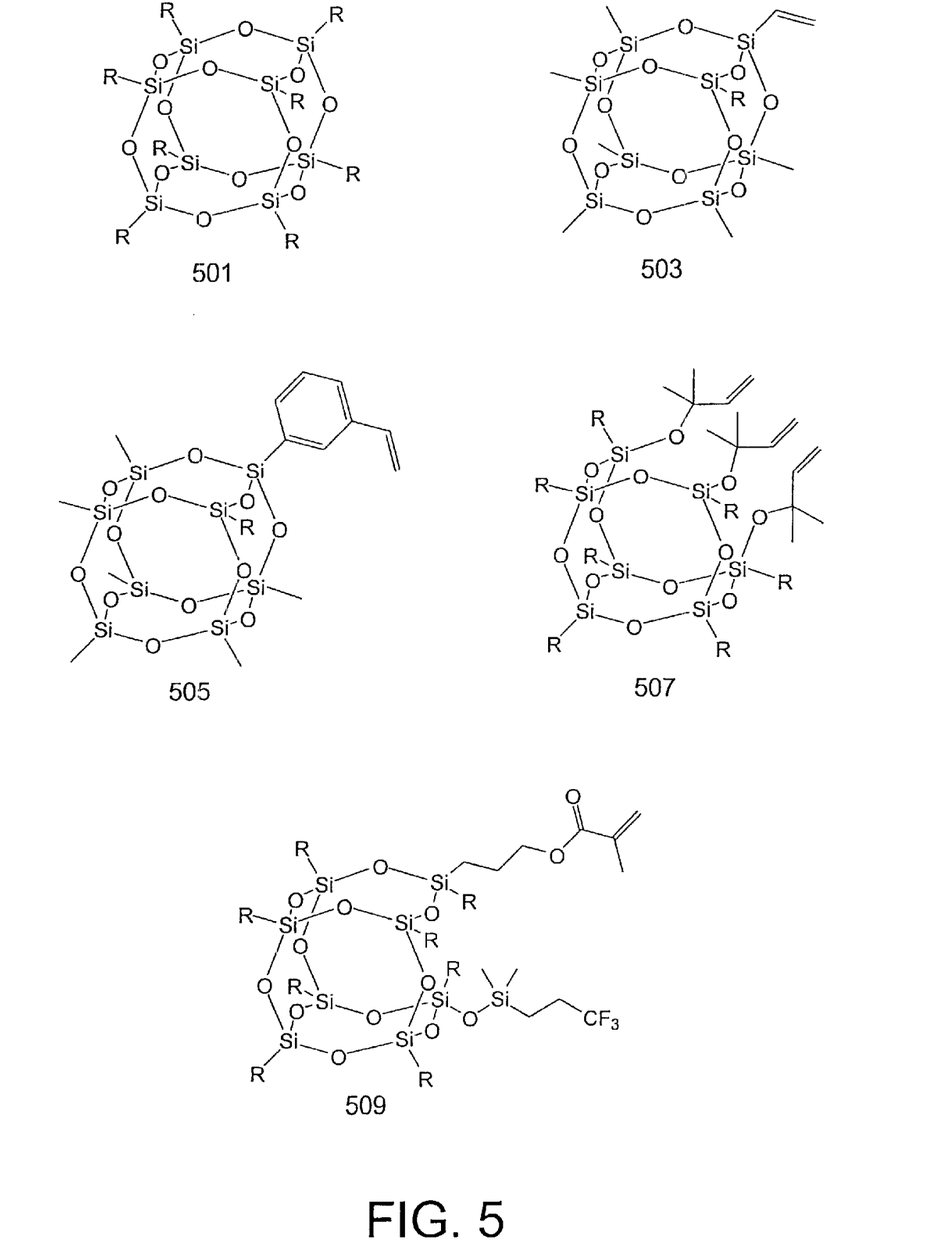
FIG. 5 depicts representative caged-siloxane precursors.

A caged siloxane moiety is a subunit of a caged siloxane precursor, that has as its molecular structure silicon atoms bridged to one another via oxygen atoms in such an arrangement so as to form a polyhedron, bowl-like, or any three dimensional form having an interior and exterior space associated with it. In one embodiment of the invention silsesquioxanes can be used as caged-siloxane precursors. FIG. 5 depicts representative caged-silsesquioxanes. Precursors of this type are readily available from commercial sources such as Hybrid Plastics (Fountain Valley, Calif.), Gelest Incorporated (Tullytown, Pa.), or Aldrich Chemical Company (Milwaukee, Wis.). Commonly these compounds are referred as POSS monomers, for Polyhedral Oligomeric SilSesquioxanes. A typical structural motif for these monomers is depicted in FIG. 5, structure 501. Molecule 501 is a polyhedron having eight silicon atoms at its vertices. The silicon atoms are linked by oxygen atom bridges. In this case, the cage is defined by eight silicon atoms, twelve oxygen atoms, and their bonding arrangement. Of course other caged-siloxane motifs are possible and this example is not intended to limit the invention. The silicon atoms also have an appended organic moiety designated R. These R groups are typically a polymerizable or graftable group (referred to as a "linker") such as acrylates, methacrylates, carboxylic acids, carboxylic acid halides, halosilanes, carboxylic acid esters, sulphonic acid esters, carbamoyl halides, epoxides, isocyanates, nitriles, olefins, styrenes, amines, alcohols, alkyl halides, aryl halides, sulphonic acids, sulphonic acid halides, phosphines, silanols, or silanes. An example would be molecule 503, FIG. 5, where only one group (a vinyl group) is polymerizable. Any one or all of the R groups can be a polymerizable or graftable group. In the case where less than all of the groups are polymerizable or graftable the remaining groups are non-reactive organic moieties. By varying the type and number of polymerizable or graftable groups, type and number of non-reactive organic moieties, structural motif of the cage, and polymerization reaction conditions, a great number of possible combinations is possible leading to a great flexibility in forming dielectric films with desirable properties.

So as not to obscure the invention, further discussion will focus on POSS materials of the general structural motif just described. As outlined earlier, there are a number of different polymerizable groups which can be used to link caged-siloxane monomers. Another variable available within a particular type of polymerizable group is the length of tether used between the polymerizable group and the silicon atom of the cage structure. For example in FIG. 5, molecule 505 has an arylvinyl group. Relative to 503, 505 has a longer tether and thus its involvement in a polymerization reaction would produce films with different bulk properties.

The invention describes caged structures and functionally this can mean cage-like, cup-shaped, or even bowl-shaped structures. For example in FIG. 5, molecule 507 has one of the vertices of the cage opened. This molecules' shape represents a cage for the most part, and when polymerized, the nearly complete cage as defined by the seven silicon atoms and twelve oxygen atoms will remain essentially intact.

Another example of combinations of the aforementioned variables for effecting bulk properties is illustrated in FIG. 5, molecule 509. Monomer 509 has organic non-reactive R groups, a polymerizable acrylate group, an appended fluorocarbon moiety, and has a partially-open cage structure. Any one of these individual variables in 509 can be changed to adjust the physical characteristics of the final dielectric material. Of course, one can not only utilize these materials for homopolymers, but combinations of different caged-siloxane monomers can be used to make copolymers.

The low-k properties of the dielectrics of the invention are produced not only due to the silicon dioxide like nature of the materials but also due to their porous nature. The pore size and structure is not only defined by the cage of the siloxane monomer, but also by judicious choice of tether length for the polymerizable group. By linking caged-siloxane monomers, a caged network polymer is formed, in which pores are formed between the original monomer cage structures. By varying the tether length one can produce dielectrics with highly uniform pore size or variable pore size. That is, the pores defined between the original monomer cage structures can be of the same or different size than that of the original cage of the monomer. Likewise pore size inhomogeneity can be produced in copolymerization schemes wherein monomers of different pore size are used. Varying the pore size in the dielectric is not only important for affecting the dielectric constant of the material, but also the bulk properties such as plasticity, glass transition temperatures, and deformation characteristics. All of the aforementioned properties can be enhanced by the type and quantity of organic content in the final material ultimately resulting from the choice of appended groups in the monomer precursors.

The polymerization reactions described for the invention can be done at ambient or near ambient conditions. The invention does not require a high temperature anneal for forming low-k materials and in fact such a step would diminish the dielectric constant in the final material, vida infra. Since ambient or near ambient conditions are used, the invention need not be characterized by a polymerization reaction. Caged-siloxanes used for the invention may have appended groups that allow self assembly or interlock at the molecular level due to hydrogen bonding, ionic bonding, or other electrostatic forces. Partially open caged structures may be designed in such a way as to interlock themselves, without reliance on appended linkers.

As mentioned, this invention also pertains to dielectric layers containing caged siloxane moieties of the types described above. Generally, such layers are provided on integrated circuits or partially fabricated integrated circuits. The layers serve to electrically isolate adjacent metal layers or other conductive features. Preferably, the dielectric layers are used in defining inlaid damascene features. In these structures, the individual caged siloxane moieties are linked to one another (and possibly other features of the integrated circuit) by covalent (typical) or non-covalent (less typical) bonds. The resulting matrix contains intact and largely immobile siloxane cages attached to one another to form the dielectric layer of interest.

Generally, the dielectric layers of this invention possess a low dielectric constant, good mechanically stability, and resistance to degradation at temperatures commonly employed in IC fabrication. In one example, the dielectric layers of this invention have a porosity of between about 25% and 75%, more preferably between about 40% and 60%. Further, such dielectric layers may have on average pore size of not more than about 200 angstroms, more preferably an average pore size of between about 5 and 25 angstroms. Remember that the pores help to lower the dielectric constant of the material. So in one view, more pores are better. On the other hand, if the material becomes too porous its mechanical integrity is compromised. Also the pores should be small relative to the device features to ensure that there is a dielectric barrier between all desired conducting lines. Thus, the average pore size and maximum porosity should be limited.

The thickness of the dielectric layer can be chosen to be any value suitable for use with the IC fabrication process at hand. Typically, in a conventional fabrication process, the thickness will be at most 10,000 angstroms, more preferably at most 5000 angstroms. The thickness must be chosen in accordance with the design of the IC device for which it is intended.

The dielectric layers of the invention are of low dielectric constant, thus in one example they have a dielectric constant of at most about 3.5. Further, such dielectric layers may have a dielectric constant of at most 2.5, more preferably at most 2.0.

In summary, the invention provides a method and apparatus for depositing a low-k (less than 3.0) dielectric using supercritical fluid as a medium. The invention also provides integrated circuit dielectric layers including caged siloxane moieties. The dielectrics produced are hybrid organic-inorganic polymers or assemblies that are porous in nature. The dielectric constants of the materials produced by the invention are produced by virtue of the porosity of the material and the composition of the organic-inorganic polymer matrix.

While this invention has been described in terns of a few preferred embodiments, it should not be limited to the specifics presented above. Many variations on the above-described preferred embodiments may be employed. Therefore, the invention should be broadly interpreted with reference to the following claims. For example, this invention has been described in the context of forming a dielectric layer on a semiconductor substrate such as a partially fabricated integrated circuit. The invention is not limited to semiconductor substrates. Various other substrates can be coated with low-k dielectric layers using this invention. Examples of other substrates include "packaging" for integrated circuits and the like.

What is claimed is:

1. An integrated circuit or partially fabricated integrated circuit including one or more dielectric layers, at least one of the dielectric layers comprising:

a plurality of chemically linked caged siloxane moieties,
wherein the at least one dielectric layer has a dielectric constant of at most about 2.

2. The integrated circuit or partially fabricated integrated circuit of claim 1, wherein the at least one dielectric layer forms a first layer of a dual damascene dielectric structure.

3. The integrated circuit or partially fabricated integrated circuit of claim 1, wherein the at least one dielectric layer forms a second layer of a dual damascene dielectric structure.

4. An integrated circuit or partially fabricated integrated circuit including one or more dielectric layers, at least one of the dielectric layers comprising:
a plurality of chemically linked caged siloxane moieties,
wherein the at least one dielectric layer has a porosity of between about 25% and 75%.

5. The integrated circuit or partially fabricated integrated circuit of claim 4, wherein the at least one dielectric layer has a porosity of between about 40% and 60%.

6. An integrated circuit or partially fabricated integrated circuit including one or more dielectric layers, at least one of the dielectric layers comprising:
a plurality of chemically linked caged siloxane moieties,
wherein the at least one dielectric layer has an average pore size of at most about 200 Angstroms.

7. The integrated circuit or partially fabricated integrated circuit of claim 6, wherein the at least one dielectric layer has an average pore size of between about 5 and 25 Angstroms.

8. The integrated circuit or partially fabricated integrated circuit of claim 1, wherein the at least one dielectric layer has a dielectric constant of at most about 3.5.

9. The integrated circuit or partially fabricated integrated circuit of claim 1, wherein the at least one dielectric layer has a dielectric constant of at most about 2.5.

10. An integrated circuit or partially fabricated integrated circuit including one or more dielectric layers, at least one of the dielectric layers comprising:
a plurality of chemically linked caged siloxane moieties;
wherein the caged siloxane moieties are linked using polymerizable side chains selected from the group consisting of acrylates, methacrylates, carboxylic acids, carboxylic acid halides, halosilanes, carboxylic acid esters, sulphonic acid esters, carbamoyl halides, epoxides, isocyanates, nitriles, olefins, styrenes, amines, alcohols, alkyl halides, aryl halides, sulphonic acids, sulphonic acid halides, phosphines, silanols, and silanes,
wherein the at least one dielectric layer has a porosity of between about 25% and 75%.

11. The integrated circuit or partially fabricated integrated circuit of claim 1, wherein the at least one dielectric layer has a thickness of at most about 10,000 Angstroms.

12. The integrated circuit or partially fabricated integrated circuit of claim 1, wherein the at least one dielectric layer has a thickness of at most about 5,000 Angstroms.

13. The integrated circuit or partially fabricated integrated circuit of claim 1, wherein the caged siloxane moieties are silsesquioxanes.

14. The integrated circuit or partially fabricated integrated circuit of claim 1, wherein the caged siloxane moieties are obtained from polyhedral oligomeric silsesquioxanes (POSS) monomers.

15. An integrated circuit or partially fabricated integrated circuit including one or more dielectric layers, at least one of the dielectric layers comprising:
a plurality of chemically linked caged siloxane moieties,
wherein the caged siloxane moieties have a cage diameter of between about 5 and 50 Angstroms.

16. The integrated circuit or partially fabricated integrated circuit of claim 15, wherein the caged siloxane moieties have a cage diameter of between about 10 and 20 Angstroms.

17. The integrated circuit or partially fabricated integrated circuit of claim 1, wherein the caged siloxane moieties are linked to one another by an organic linker.

18. The integrated circuit or partially fabricated integrated circuit of claim 1, wherein the caged siloxane moieties are linked to one another using a polymerization reaction.

19. An integrated circuit or partially fabricated integrated circuit including one or more dielectric layers, at least one of the dielectric layers comprising:
a plurality of chemically linked caged siloxane moieties,
wherein the caged siloxane moieties are grafted on said integrated circuit or partially fabricated integrated circuit.

20. The integrated circuit or partially fabricated integrated circuit of claim 1, wherein the caged siloxane moieties are linked using polymerizable side chains selected from the group consisting of acrylates, methacrylates, carboxylic acids, carboxylic acid halides, halosilanes, carboxylic acid esters, sulphonic acid esters, carbamoyl halides, epoxides, isocyanates, nitrites, olefins, styrenes, amines, alcohols, alkyl halides, aryl halides, sulphonic acids, sulphonic acid halides, phosphines, silanols, and silanes.

21. The integrated circuit or partially fabricated integrated circuit of claim 19, wherein the caged siloxane moieties are grafted on said partially fabricated integrated circuit using reactive side chains selected from the group consisting of acrylates, methacrylates, carboxylic acids, carboxylic acid halides, halosilanes, carboxylic acid esters, sulphonic acid esters, carbamoyl halides, epoxides, isocyanates, nitrites, olefins, styrenes, amines, alcohols, alkyl halides, aryl halides, sulphonic acids, sulphonic acid halides, phosphines, silanols, and silanes.

22. An integrated circuit or partially fabricated integrated circuit including one or more dielectric layers, at least one of the dielectric layers comprising:
a plurality of chemically linked caged siloxane moieties,
wherein the caged siloxane moieties are linked to one another by non-covalent self assembly.

23. The integrated circuit or partially fabricated integrated circuit of claim 1, wherein the caged siloxane moieties of the at least one dielectric layer include at least two chemically distinct species of caged siloxane.

24. A method of forming a dielectric layer in an integrated circuit, the method comprising:
contacting a partially fabricated integrated circuit with a carrier containing caged siloxane species;
linking the caged siloxane species to form the dielectric layer on the partially fabricated integrated circuit; and
etching said dielectric layer to form a dielectric layer,
wherein the carrier is a supercritical fluid or near-supercritical fluid when contacting the partially fabricated integrated circuit.

25. A method of forming a dielectric layer in an integrated circuit, the method comprising:
contacting a partially fabricated integrated circuit with a supercritical or near supercritical fluid carrier containing caged siloxane species; and
linking the caged siloxane species to form the dielectric layer on the partially fabricated integrated circuit; and etching said dielectric layer to form a Damascene dielectric layer.

26. The method of claim 24, wherein the supercritical fluid is selected from a group consisting of supercritical carbon dioxide, supercritical ammonia, supercritical water, supercritical ethanol, supercritical ethane, supercritical propane, supercritical butane, supercritical pentane, supercritical dimethyl ether, supercritical hexafluoroethane, and mixtures thereof.

27. The method of claim 24, wherein the supercritical fluid is supercritical carbon dioxide.

28. The method of claim 24, wherein the caged siloxane species are silsesquioxanes.

29. A method of forming a dielectric layer in an integrated circuit, the method comprising:

contacting a partially fabricated integrated circuit with a carrier containing caged siloxane species;

linking the caged siloxane species to form the dielectric layer on the partially fabricated integrated circuit; and etching said dielectric layer to form a dielectric layer, wherein the caged siloxane species are selected from the group consisting of tris(dimethylvinyl)-POSS, methacrylfluoro(3)-POSS, and methacrylfluoro(13)-POSS.

30. A method of forming a dielectric layer in an integrated circuit, the method comprising:

contacting a partially fabricated integrated circuit with a carrier containing caged siloxane species;

linking the caged siloxane species to form the dielectric layer on the partially fabricated integrated circuit; and etching said dielectric layer to form a dielectric layer, wherein the caged siloxane species have a cage diameter of between about 5 and 50 Angstroms.

31. The method of claim 30, wherein the caged siloxane species have a cage diameter of between about 10 and 20 Angstroms.

32. The method of claim 24, wherein the caged siloxane species are linked to one another by an organic linker.

33. The method of claim 24, wherein the caged siloxane species are linked to one another using a polymerization reaction.

34. A method of forming a dielectric layer in an integrated circuit, the method comprising:

contacting a partially fabricated integrated circuit with a carrier containing caged siloxane species;

linking the caged siloxane species to form the dielectric layer on the partially fabricated integrated circuit; and etching said dielectric layer to form a dielectric layer, wherein the caged siloxane species are grafted on said integrated circuit or partially fabricated integrated circuit.

35. A method of forming a dielectric layer in an integrated circuit, the method comprising:

contacting a partially fabricated integrated circuit with a carrier containing caged siloxane species;

linking the caged siloxane species to form the dielectric layer on the partially fabricated integrated circuit; and etching said dielectric layer to form a dielectric layer, wherein the caged siloxane species are linked using polymerizable side chains selected from the group consisting of acrylates, methacrylates, carboxylic acids, carboxylic acid halides, halosilanes, carboxylic acid esters, sulphonic acid esters, carbamoyl halides, epoxides, isocyanates, nitriles, olefins, styrenes, amines, alcohols, alkyl halides, aryl halides, sulphonic acids, sulphonic acid halides, phosphines, silanols, and silanes.

36. The method of claim 34, wherein the caged siloxane species are grafted on said partially fabricated integrated circuit using reactive side chains selected from the group consisting of acrylates, methacrylates, carboxylic acids, carboxylic acid halides, halosilanes, carboxylic acid esters, sulphonic acid esters, carbamoyl halides, epoxides, isocyanates, nitriles, olefins, styrenes, amines, alcohols, alkyl halides, aryl halides, sulphonic acids, sulphonic acid halides, phosphines, silanols, and silanes.

37. A method of forming a dielectric layer in an integrated circuit, the method comprising:

contacting a partially fabricated integrated circuit with a carrier containing caged siloxane species;

linking the caged siloxane species to form the dielectric layer on the partially fabricated integrated circuit; and etching said dielectric layer to form a dielectric layer, wherein the caged siloxane species are linked to one another using non-covalent self assembly.

38. The method of claim 24, wherein the caged siloxane species include at least two chemically distinct species of caged siloxane.

39. The method of claim 24, further comprising converting the carrier to a supercritical state.

40. The method of claim 39, wherein converting the carrier to a supercritical state is performed prior to contacting the partially fabricated integrated circuit with the carrier.

41. The method of claim 39, wherein converting the carrier to a supercritical state is performed upon contacting the partially fabricated integrated circuit with the carrier.

42. A method of forming a dielectric layer in an integrated circuit, the method comprising:

contacting a partially fabricated integrated circuit with a carrier containing caged siloxane species;

linking the caged siloxane species to form the dielectric layer on the partially fabricated integrated circuit; and etching said dielectric layer to form a dielectric layer; and removing the carrier after linking the caged siloxane species.

43. The method of claim 42, wherein removing the carrier also removes at least one of byproducts of the linking reaction and unreacted caged siloxane species.

44. A method of forming a dielectric layer in an integrated circuit, the method comprising:

contacting a partially fabricated integrated circuit with a carrier containing caged siloxane species;

linking the caged siloxane species to form the dielectric layer on the partially fabricated integrated circuit; and etching said dielectric layer to form a dielectric layer; and flushing the carrier from the partially fabricated integrated circuit after linking the caged siloxane species.

45. The method of claim 24, further comprising etching the dielectric layer to form at least one of vias and trenches.

* * * * *

UNITED STATES PATENT AND TRADEMARK OFFICE
CERTIFICATE OF CORRECTION

PATENT NO. : 6,576,345 B1
DATED : June 10, 2003
INVENTOR(S) : Van Cleemput et al.

It is certified that error appears in the above-identified patent and that said Letters Patent is hereby corrected as shown below:

<u>Title page,</u>
Item [73], add Assignee, -- Novellus Systems, Inc., San Jose, CA (US) --

Signed and Sealed this

Twelfth Day of August, 2003

JAMES E. ROGAN
*Director of the United States Patent and Trademark Office*